United States Patent [19]

Cha et al.

[11] Patent Number: 4,553,049
[45] Date of Patent: Nov. 12, 1985

[54] OSCILLATION PREVENTION DURING TESTING OF INTEGRATED CIRCUIT LOGIC CHIPS

[75] Inventors: Charles W. Cha, Yorktown Heights; John W. Hartman; David A. Kiesling, both of LaGrangeville; William J. Scarpero, Jr., Poughkeepsie, all of N.Y.

[73] Assignee: International Business Machines Corporation, Armonk, N.Y.

[21] Appl. No.: 540,072

[22] Filed: Oct. 7, 1983

[51] Int. Cl.4 .................... H03K 19/092; H03K 17/62
[52] U.S. Cl. ............................... 307/443; 307/200 A; 307/467; 324/73 R
[58] Field of Search ................... 307/200 A, 443, 445, 307/455, 465–467, 470, 475, 270; 324/73 R, 73 AT, 158 R; 371/15

[56] References Cited

U.S. PATENT DOCUMENTS

| 3,812,426 | 5/1974 | Illian | 324/73 R |
|---|---|---|---|
| 4,000,460 | 12/1976 | Kadikia et al. | 324/73 R |
| 4,070,565 | 1/1978 | Borelli | 235/302 |
| 4,151,425 | 4/1979 | Cappa | 307/200 A X |
| 4,204,633 | 5/1980 | Goel | 371/27 |
| 4,357,703 | 11/1982 | Van Brunt | 324/73 R X |
| 4,382,197 | 5/1983 | Kiyozuka | 307/443 X |
| 4,394,588 | 7/1983 | Gaudenzi | 307/443 |
| 4,398,106 | 8/1983 | Davidson et al. | 307/200 A X |
| 4,439,858 | 3/1984 | Petersen | 324/73 AT X |
| 4,499,579 | 2/1985 | Still et al. | 324/73 R X |
| 4,513,210 | 4/1985 | Barre | 307/467 X |

OTHER PUBLICATIONS

IBM TDB, vol. 20, No. 4, Sep. 1977, "Disturbance Reduction Techniques", J. A. Waicukauski, pp. 1415–1417.
IBM TDB, vol. 23, No. 8, Jan. 1981, "Module-in-Place Isolation Technique Using Analog-to-Digital Converters", L. M. Zobniw, pp. 3628–3630.
IBM TDB, vol. 23, No. 8, Jan. 1971, "Test Method for VLSI Semiconductor Chips", H. Gepraegs & H. Tandjung, pp. 3743–3744.
IBM TDB, vol. 23, No. 9, Feb. 1981, "Module-in-Place Testing Autoguided Probe Isolation and Diagnostic Technique", E. W. Jackson & L. M. Zobniw, pp. 4078–4079.
IBM TDB, vol. 25, No. 5, Oct. 1982, "Functionally Independent AC Test for Multi-Chip Packages", P. Goel & M. T. McMahon, pp. 2308–2310.
IBM TDB, vol. 25, No. 5, Oct. 1982, "Control of Simultaneous Driver Switching With Chip Partitioning Aid", M. C. Fraf & W. J. Scarpero, Jr., pp. 2328–2330.
IBM TDB, vol. 25, No. 5, Oct. 1982, "Enhancement to 'Chip Test by Isolation'", B. C. Rosales, pp. 2311–2313.
Dorler et al, "Chip-in-Place Testing of Current-Switch Logic", IBM Tech. Disc. Bull., vol. 21, No. 3, Aug. 1978, pp. 1039–1040.
Abilevitz et al, "Circuit for Facilitating the Testing of Semiconductor Chips Mounted on a Module", IBM Tech. Disc. Bull., vol. 22, No. 2, Aug. '79, pp. 1018–1021.

Primary Examiner—Stanley D. Miller
Assistant Examiner—D. R. Hudspeth
Attorney, Agent, or Firm—Mitchell S. Bigel; Wesley DeBruin

[57] ABSTRACT

Integrated circuit logic chips often oscillate during testing because the large unbypassed inductance of the test fixture causes off-chip driver switching noise to be fed back to the logic chip power supply. Oscillation may be prevented by adding an inhibit receiver and an off-chip driver inhibit network to the logic chip. The off-chip driver inhibit network provides a fan out path from the inhibit receiver to each off-chip driver. In response to an inhibit signal applied to the inhibit receiver, the inhibit network forces each of the off-chip drivers to the same logical state, the logic state being the natural logic state assumed by the off-chip drivers upon initial application of power to the chip. The driver inhibit receiver and inhibit network are employed to prevent oscillation at chip power-on, during driver and receiver parametric testing and during input test pattern tests.

12 Claims, 2 Drawing Figures 4,553,049

OSCILLATION PREVENTION DURING TESTING OF INTEGRATED CIRCUIT LOGIC CHIPS

BACKGROUND OF THE INVENTION

1. Technical Field

This invention relates to testing of integrated circuit logic chips and more particularly to oscillation prevention during the testing thereof.

Integrated circuit logic chips are widely employed in data processing and other electronic systems. An integrated circuit logic chip typically includes a plurality of on-chip receivers for receiving binary input signals, a plurality of off-chip drivers for transmitting binary output signals, and a logic gate netwrok. The logic gates are connected between the on-chip receivers and off-chip drivers to produce binary output signals which are a predetermined logical function of the binary input signals. The logic chip also may include registers or latches for on-chip storage of intermediary signals. In the present state of the art up to sixty or more on-chip receivers and up to sixty or more off-chip drivers as well as thousands of logic gates may be integrated in a semiconductor logic chip.

Logic chips are typically tested in a logic tester. The tester typically includes a plurality of drivers for producing input signals for the logic chip and a plurality of receivers for receiving the logic chip output signals. The tester drivers and receivers are electrically connected to the chip receivers and drivers, respectively, by means of a test fixture which permits rapid chip insertion and withdrawal. The tester also typically includes means for producing various combinations of input signals for the chip under test and means for comparing the output signals produced by the chip under test with expected output signals. In order to fully test a complex logic chip, many combinations of input signals and expected output signals must be produced. The tester also typically performs parametric tests on the on-chip receivers and off-chip drivers. Parametric tests measure the electrical properties of the drivers or receivers, e.g., source and sink currents, voltage levels, and input or output impedances.

2. Background Art

As the complexity of logic chips and of the associated testers have increased, unwanted oscillation of the logic chip during testing has particularly become a problem. Unwanted oscillations often prevent the testing of a logic chip even though the logic chip is perfectly operational when placed in its intended environment.

Unwanted logic chip oscillation during testing arises when switching transients from the off-chip drivers are coupled back to the chip power supply busses through the unbypassed inductance of the test fixture. The tester itself typically includes bypass capacitors for filtering transient noise within the tester. However, the test fixture has a high inductance associated therewith. This inductance is not bypassed by the tester bypass capacitors. Accordingly, the power supply inductance seen by the chip during testing is much higher than would be typical in the intended environment.

During testing, when an off-chip driver switches binary state, the transmission line connecting the off-chip driver to the tester must be discharged. The discharge path is through the driver, and through the unbypassed inductance of the test fixture. The discharge current from the driver causes a voltage spike on the chip power supply busses, proportional to the rate of change of the current and the number of drivers switching. The noise pulse on the power supply busses is imposed on all of the logic chip circuits which are powered therefrom.

This switching noise, commonly called "ΔI noise" may cause the logic chip to change state or oscillate. The logic chip changes state when an input receiver or logic gate is disturbed and causes an off-chip driver to switch. Oscillation occurs when off-chip driver switching creates a new noise spike which in turn distrubs an input receiver or a gate and again causes the off-chip driver to change state. This oscillation continues in an uncontrollable manner.

As described above, the probability of logic state switching and chip oscillation is directly proportional to the switching speed of the off-chip drivers, the number of drivers which simultaneously switch and the unbypassed tester inductance. Logic state switching and oscillation typically manifest themselves at three time points during logic chip testing. First, when power is initially applied to the chip after it has been placed in the test fixture, a number of off-chip drivers may switch at once and thereby cause the chip to oscillate. In fact, it will be shown below that for logic chips fabricated in high speed current switch technology, all of the off-chip drivers may simultaneously switch upon application of power to the chip, to thereby cause oscillation. After initial power-on, parametric voltage level tests performed on a single on-chip receiver may cause many or all of the off-chip drivers to simultaneously switch state, thereby causing oscillations. Finally, the input pattern tests may also cause simultaneous switching of large numbers of off-chip drivers to produce oscillation. Oscillation at any point in the testing sequence precludes testing of the chip.

Since the probability of oscillation is directly proportional to the unbypassed tester inductance, the switching speed of the off-chip drivers and the number of drivers which simultaneously switch, the oscillation prolem could be solved by imposing design constraints on these parameters. For example, number of output drivers which can simultaneously switch and the switching speed of a driver can be intentionally limited by the chip designer. However, such design constraints would impose undue limitations on logic chip performance to compensate for a problem which does not occur outside of the testing environment.

DISCLOSURE OF THE INVENTION

It is accordingly an object of the invention to provide an integrated circuit logic chip which will not oscillate during the testing thereof.

It is another object of the invention to provide an oscillation preventing test method for an integrated circuit logic chip.

It is yet another object of the invention to prevent oscillation of an integrated circuit logic chip during testing without limiting or degrading the performance of the chip in its intended environment.

These and other objects are realized by providing an inhibit receiver and an off-chip driver inhibit network on the integrated circuit logic chip. The off-chip driver inhibit network provides a fan-out path from the inhibit receiver to each off-chip driver. In response to an inhibit signal applied to the inhibit receiver, the driver inhibit network forces each of the off-chip drivers to the same logical state, regardless of the logic signals applied to the off-chip drivers by the logic gate network.

The driver inhibit network is designed so that it forces each of the off-chip drivers to the state which is identical to the natural logic state assumed by the off-chip drivers upon initial application of power to the chip. The driver inhibit network is also designed so that each fan-out element thereof assumes this same logical state upon application of power to the logic chip. Accordingly, no switching transients are generated within the inhibit network and no off-chip drivers switch state as power ramps up to its steady state value.

According to the invention, the inhibit receiver and inhibit network are employed for preventing logic chip oscillation at logic chip power on, during parametric testing and during logic gate network testing.

At logic chip power on, the inhibit signal is applied to the inhibit receiver prior to applying power to the logic chip. Then, as power to the logic chip ramps up to its steady state value, the inhibit network forces all the off-chip drivers to the same state. This state is the same as the natural state of the off-chip drivers as power is initially applied to the logic chip, so that none of the off-chip drivers switch as power ramps up to its steady state value. Oscillation is accordingly prevented.

The inhibit signal is also applied to the inhibit receiver prior to and during parametric testing of the off-chip drivers and on-chip receivers. Switching of off-chip drivers during parametric testing, and the logic chip oscillation resulting therefrom, are accordingly prevented.

During functional testing of the logic gate network, the inhibit signal is applied to the inhibit receiver prior to applying a test pattern to the on-chip receivers. After the test pattern is applied, and the logic gate network is allowed to stabilize, the inhibit signal is removed. The off-chip drivers then switch state and the off-chip driver output signals are measured against their expected values. This sequence is repeated for each test pattern to be applied.

At the conclusion of logic chip testing the inhibit network is disabled, thus allowing the off-chip drivers to switch in an unconstrained manner. Accordingly, logic chip performance in its intended environment is unaffected by the inhibit network.

DETAILED DESCRIPTION OF THE INVENTION

Figure 1:
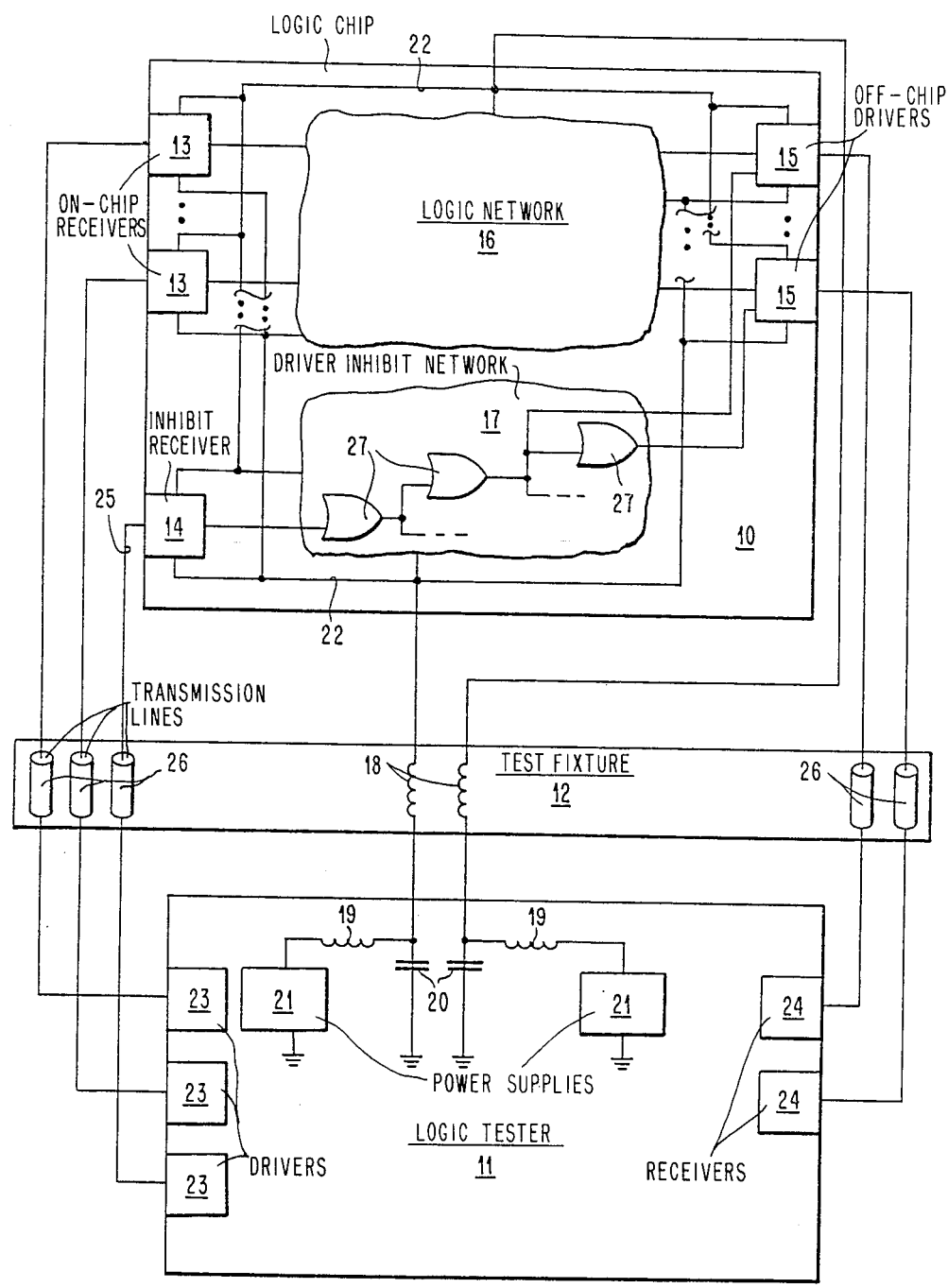
FIG. 1 is a schematic representation of an integrated circuit logic chip which includes an inhibit receiver and an off-chip driver inhibit network according to the present invention.

Referring now to FIG. 1, there is schematically illustrated an integrated circuit logic chip 10 being tested in a logic tester 11. Logic chip 10 includes a plurality of on-chip receivers 13, a plurality of off-chip drivers 15 and a logic network 16 for producing a predetermined logic function. The integrated circuit also includes power supply busses 22 for coupling on-chip receivers 13, off-chip drivers 15 and logic network 16 to one or more suitable sources of electrical power.

As illustrated in FIG. 1, logic tester 11 includes a plurality of drivers 23 for placing predetermined signals at chip receivers 13 via transmission lines 26, and a plurality of receivers 24 for receiving output signals from off-chip drivers 15 via transmission lines 26. The detailed operation of the tester and the manner in which the input signals are generated and the output signals processed do not form a part of this invention and will not be described further.

As further shown in FIG. 1, power for integrated circuit logic chip 10 is provided by tester 11 during testing. A plurality of power supplies 21 are coupled to the appropriate power busses 22 on integrated circuit 10 via test fixture 12. Two or more busses may be employed, with one of the busses being a ground buss. Test fixture 12 includes unbypassed inductance 18 which is inherent in the design thereof. Also represented schematically is bypassed inductance 19 which is bypassed via capacitors 20. It will be noted that as a result of the design of test fixture 12, the unbypassed inductance 18, seen by integrated circuit logic chip 10 is much higher than would be seen when integrated circuit logic chip 10 is mounted in a data processor or other electronic system.

The manner in which oscillation may arise during testing will now be described. During testing, when an off-chip driver 15 switches logical state, the charge in the associated transmission line 26 must be discharged. The discharge path is via current flow through off-chip driver 15 and through the unbypassed inductance 18 of test fixture 12 via integrated circuit power supply buss 22. The discharge current spike induces a voltage spike on power supply busses 22 according to the well known relationship $V = nLdi/dt$, where V is the induced voltage, L is the value of unbypassed inductance 18 di/dt is the rate of change of the current, and n is the number of simultaneously switching off-chip drivers 15. The voltage spike on power supply buss 22 is transmitted to all of the on-chip receivers 13, off-chip drivers 15 and all the components of logic network 16. This switching noise, commonly called "ΔI noise" may cause an on-chip receiver 13 or a gate in logic network 16 to change logical state. This logical state change may cause an off-chip driver 15 to change state, so that the response of the logic chip to a given input pattern is not the expected response. Moreover, a logic state change in one or more off-chip drivers 15 may create a new voltage spike which causes further switching of off-chip drivers. Logic chip 10 thus oscillates in an uncontrollable manner, and testing is precluded. It will also be noted that the oscillating chip may be perfectly functional when placed in its intended environment where the unbypassed power supply inductance is minimal. However, since the chip cannot be tested, it must be classified as defective.

Uncontrolled oscillation during testing is prevented according to the inention by adding an inhibit receiver 14 and a driver inhibit network 17 to integrated circuit logic chip 10. The input receiver 15 receives an inhibit signal 25 at the input thereof. The driver inhibit network 17 is a network of gates 27 which provides a fan out of inhibit signal 25 to each off-chip driver 15. When inhibit signal 25 is present, all the off-chip drivers 15 are forced to the same logical state regardless of the signals applied to drivers 15 by logic network 16.

Inhibit receiver 14 and inhibit network 17 may be employed for preventing oscillation during testing as follows: After integrated circuit 10 is inserted into test fixture 12, inhibit signal 25 is applied to inhibit receiver 14 prior to applying power to the chip. Then, power is applied to the chip. Inhibit network 17 is designed so that as power ramps up (i.e., as power approaches its steady state value), each of the off-chip drivers 15 is forced to the logical state which is dientical to the natural logical state assumed by the off-chip drivers upon initial application of power to the chip. Accordingly, none of drivers 15 switch as power ramps up to its steady state value. The design of such an inhibit network will be illustrated for current switch logic technology in connection with FIG. 2.

After the chip is powered, parametric tests are typically performed upon on-chip receivers 13 and offchip drivers 15. Prior to performing parametric tests, the inhibit signal is applied to inhibit receiver 14 thereby forcing off-chip drivers 15 to the same logical state regardless of the logic signals applied to drivers 15 by logic gate network 16. Then, when current, voltage, resistance and c ontinuity tests are performed on receivers 13 and drivers 15 it can be assured that these tests do not cause drivers 15 to switch and the chip to break into oscillation. At the conclusion of parametric testing, the inhibit signal is removed.

The inhibit receiver and inhibit network are employed during functional testing of logic network 16 as well. Functional testing takes place as follows: First, inhibit signal 25 is applied so that off-chip drivers 15 are forced to the same logical state regardless of the logic signals applied to drivers 15 by logic gate network 16. Then, tester 11 generates the appropriate test pattern signals at tester drivers 23. These signals are applied to on-chip receivers 13. These test pattern signals may be applied directly to logic network 16 or may be applied to on-chip registers for intermediate storage in connection with well known Level Sensitive Scan Design testing techniques. Application of test pattern signals causes transient switching in logic network 16. However, transient switching in logic network 16 does not affect switching of the output drivers because they are inhibited. Once the logic network has stabilized, inhibit signal 25 is removed and the logic network is allowed to cause off-chip drivers 15 to switch state. The signals on off-chip drivers 15 are received by tester/receivers 24 and compared with the expected results. The inhibit signal is again applied and a new input pattern is placed on on-chip receivers 13. This process repeats until all of the input pattern combinations are tested.

After testing, driver inhibit signal 25 is disabled so that it has no effect on the switching of off-chip drivers 15 when integrated circuit 10 is placed in its intended environment. Thus, the performance of integrated circuit 10 is not degraded in order to satisfy testing requirements.

Figure 2:
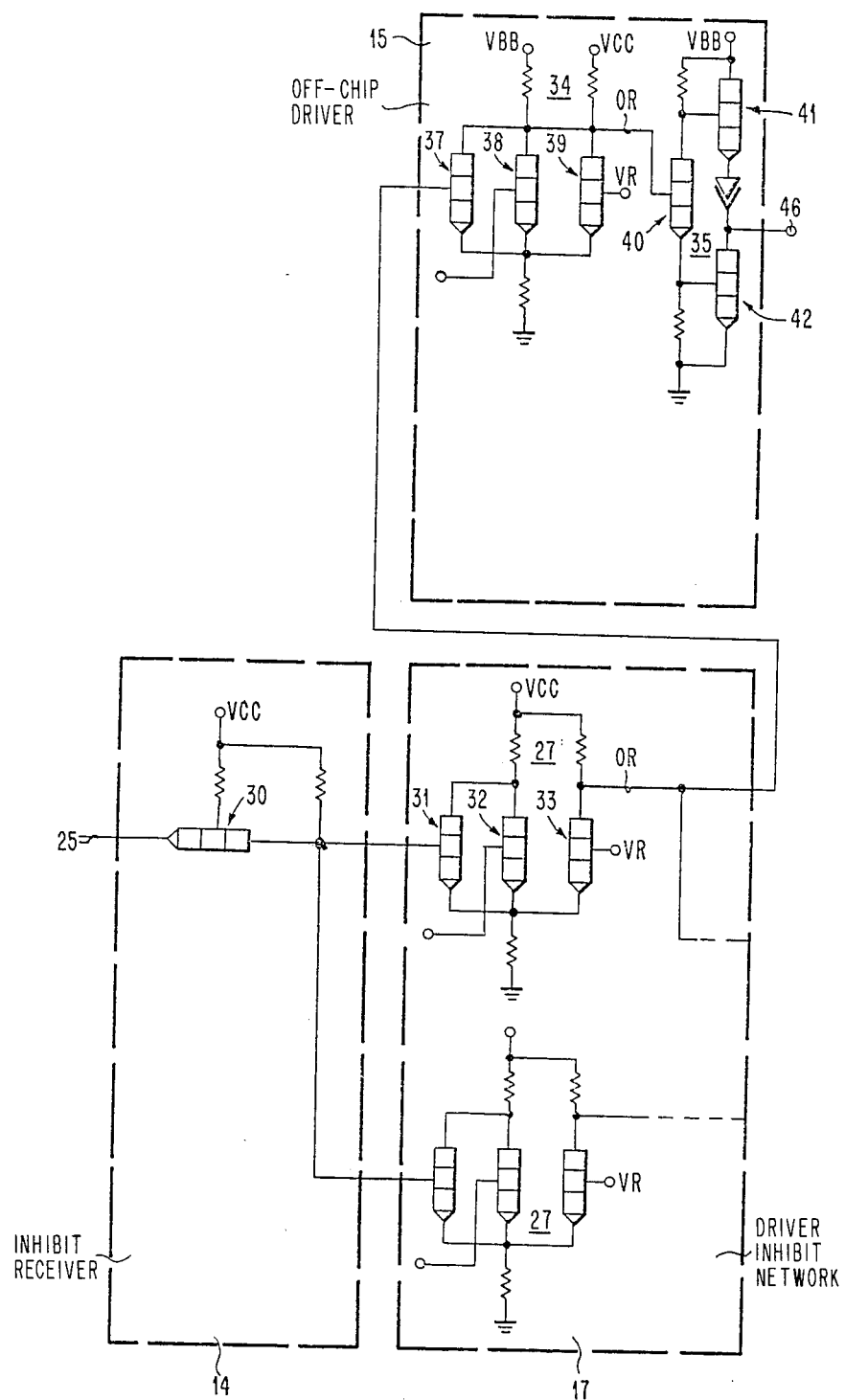
FIG. 2 is a detailed schematic of an inhibit receiver, an off-chip driver inhibit network and an off-chip driver fabricated in current switch technology according to the present invention.

Referring now to FIG. 2, a current switch logic (also known as emitter coupled logic) implementation of inhibit receiver 14, driver inhibit network 17 and off-chip driver 15 is described. While it will be recognized that the inhibit receiver and driver inhibit network of the present invention may be employed with any logic technology (e.g., transistor-transistor logic, integrated injection logic, etc.) it finds particular utility in high speed current switch technology. Moreover, the design of driver inhibit network 17 is particularly critical when dealing with current switch technology.

As is well known to those skilled in the art, current switch logic employs a reference voltage which is generally midway between the binary ZERO and ONE voltage levels, with binary ZERO being less than the reference voltage and binary ONE being greater than the reference voltage. A current switch logic gate typically includes at least three transistors, the emitters of all of which are coupled in common to a current source, and the collectors of which are coupled to a voltage supply. The base of one transistor is coupled to the reference voltage while the bases of the remaining transistors form the logic inputs to the logic gate. If the base voltage of any of the logic input transistors is greater than the reference voltage, the logic input transistor will conduct and the reference voltage transistor will be off. If, on the other hand, the bases of all of the logic input transistors are lower than the reference voltage, then only the reference voltage transistor will conduct. Accordingly , a current switch logic gate performs OR logic, with the output being at logic level ONE if one or more of the logic inputs are at logic level ONE.

In the present state of the art, current switch logic integrated circuit chips employ on-chip reference voltage generators for generating the reference voltage from the chip power supply voltage. Accordingly, when power is first applied to the chip, the reference voltage will not attain its steady state value until after the chip power supply voltage has attained its steady state value. This lagging effect can cause all of the off-chip drivers on a logic chip to switch state as power ramps up to its steady state value, in the following manner:

When power is initially applied to the logic chip, the natural state of the off-chip drivers will be logic ONE. This is because as the power begins to ramp up, the driver inputr voltages and the reference voltage will begin to rise toward the steady state logic ZERO and steady state reference voltage levels, respectively, with the reference voltage being less than the input voltage due to the reference voltage lag. Since the input voltage is greater than the reference voltage, the natural state of the driver at power-on is logic ONE. The input voltage continues to ramp up to its steady state logic ZERO value. Then, as the reference voltage continues to ramp up to its steady state value (which is greater than the logic ZERO voltage level) the reference voltage will reach a point when it exceeds the logic ZERO voltage level. At this point in time, all of the off-chip drivers will simultaneously switch to logic ZERO and the chip will break into oscillation.

According to the present invention, the off-chip driver inhibit network is designed so that all of the off-chip drivers are maintained at logic ONE level as power ramps up to its steady state value. In order to ensure that no switching occurs, the internal fan out elements of the inhibit network must also be designed so that each fan out element is always at logic ONE as power ramps up to its steady state value. Thus there can be no logic inverting elements in the inhibit network.

Referring now to FIG. 2, the current switch logic implementation of an on-chip receiver 14, driver inhibit network 17 and off-chip driver 15 is illustrated. On-chip receiver 14 includes transistor 30, with inhibit signal 25 being applied to the emitter thereof. In the design of FIG. 2, inhibit signal 25 is logic level ONE (i.e., above the reference voltage). Driver inhibit network 17 comprises a fan out arrangement of current switch OR gates 27. In FIG. 2, two OR gates 27 are shown. However, it will be realized by those having skill in the art that for typical integrated circuit logic chips, a large number of OR gates will be required to fan out to all off-chip drivers 15.

Referring again to FIG. 2, an OR gate 27 includes a reference transistor 33 and a pair of logic input transistors 31, 32. The base of reference transistor 33 is connected to reference voltage $V_R$. The base of one logic input transistor 31 is directly or indirectly connected to on-chip receiver 14, while the base of the remaining logic input transistors 32 may be left unconnected. The OR output of gate 27 is directly or indirectly connected to an off-chip driver 15.

Off-chip driver 15 includes an OR gate 34 which comprises reference transistor 39 and logic input transistors 37, 38, and a push-pull driver 35 comprising transistors 40-42. The base of logic input transistor 37 is connected to driver inhibit network 17 while the base of logic input transistor 38 is coupled to logic network 16 (FIG. 1) for receiving logic signals therefrom in a conventional manner.

Operation of the current switch logic embodiment of FIG. 2 will now be described in connection with the logic chip power-up operation in the test environment. Prior to applying power to the logic chip, a logic ONE inhibit signal 25 is applied to an on-chip receiver 14. Then, power is applied to the chip. As power ramps up to its steady state value, the base of at least one logic input transistor (e.g., 31) of each OR gate 27 in inhibit network 17 will likewise rise to logic ONE. Since the reference voltage lags the chip power supply voltage, the bases of at least one logic input transistor (e.g., 31) per OR gate will always be at a higher voltage than the bases of OR gate reference transistors (e.g., 33). Accordingly the OR output of each gate 27 will remain at logic ONE. Since the OR output is always at logic ONE, the base of transistor 37 will also always be at logic ONE, and driver 15 will not switch as power ramps up to its steady state value.

In connection with FIG. 2, it will be noted that inhibit receiver 14 and driver inhibit network 17 maintain the input to driver 15 above the reference voltage at all times as power ramps up to its steady state value. Thus, the drivers never switch during power up. In the absence of driver inhibit receiver 14 and inhibit network 17, the base of transistor 38 would rise to logic level ZERO, while the base of transistor 39 would rise to the reference voltage level. At the point in time when the base voltage of transistor 39 exceeded the base voltage of transistor 38, driver 15 would switch from logic level ONE to logic level ZERO. Simultaneous switching of all drivers would cause the chip to oscillate.

A logic ONE inhibit signal 25 is likewise applied to receiver 14 prior to and during parametric tests, and prior to applying a input test pattern to thereby force all drivers 15 to logic ONE and prevent oscillation. After testing, the emitter of transistor 30 is grounded, so that the inhibit network 17 has no effect on the state of driver 15.

While the invention has been particularly shown and described with reference to a preferred embodiment thereof, it will be understood by those skilled in the art that various changes in form and details may be made without departing from the spirit and scope of the invention.

We claim:
1. An integrated circuit logic chip comprising:
a plurality of on-chip receivers;
a plurality of off-chip drivers;
a logic network for connecting said on-chip receivers and said off-chip drivers in a predetermined logic configuration; and
driver inhibit means, responsive to an inhibit signal, for forcing said plurality of off-chip drivers to the same logical state at predetermined times during testing of said integrated circuit logic chip, said same logical state being the natural logical state of said off-chip drivers upon intial application of electrical power to said integrated circuit chip;
whereby integrated circuit logic chip oscillation during testing is prevented.

2. The integrated circuit logic chip of claim 1 wherein said driver inhibit means comprises an inhibit receiver, responsive to said input signal, and a driver inhibit network for connecting said inhibit receiver to each of said off-chip dirvers.

3. The integrated circuit logic chip of claim 2 wherein said driver inhibit network is a fan out network of logic gates.

4. The integrated circuit logic chip of claim 3 wherein the logic gates in said driver inhibit network are forced to said same logical state in response to said inhibit signal.

5. The integrated circuit logic chip of claim 1 wherein said logic chip is fabricated in current switch technology, with logic ONE being a voltage level greater than a predetermined reference voltage and logic ZERO being a voltage level less than said prefetermined voltage level, wherein said driver inhibit means is a fan out network of OR gates, wherein said inhibit signal is a logic ONE signal and wherein said same logical state is logic ONE state.

6. In an integrated circuit logic chip fabricated in current switch technology, including a plurality of on-chip receivers, a plurality of off-chip drivers and a logic network for connecting said on-chip receivers and said off-chip drivers in a predetermined logic configuration, said integrated circuit logic chip including a reference voltage source, with logic ONE being a voltage level greater than said reference voltage and logic ZERO being a voltage level less than said reference voltage, means for ensuring that said off-chip drivers do not switch logic state upon application of electrical power to said chip, comprising:
an inhibit receiver;
an OR-gate fan out network connecting said driver inhibit receiver to each of said off-chip drivers; and
means for applying a logic ONE signal to said inhibit receiver prior to applying power to said chip, to thereby force all the OR gates in said fan out network and all of said off-chip drivers to logic ONE as power ramps up to its steady state value.

7. The integrated circuit logic chip of claim 6 wherein said off-chip drivers include an input OR gate having at least two logic inputs, one of which is connected to said logic network and the other of which is connected to said OR-gate fan out network, and a driver circuit connected to said input OR gate.

8. In an integrated circuit logic chip comprising a plurality of on-chip receivers, a plurality of off-chip drivers and a logic network for connecting said on-chip receivers and said off-chip drivers in a predetermined logic configuration, a method of preventing oscillations in said integrated circuit logic chip upon application of power thereto, comprising the steps of:
applying an inhibit signal to said off-chip drivers prior to application of electrical power to said integrated circuit logic chip, said inhibit signal preventing said off-chip drivers from switching logical state as electrical power is applied to said integrated circuit logic chip; and applying electrical power to said integrated circuit logic chip.

9. In an integrated circuit logic chip comprising a plurality of on-chip receivers, a plurality of off-chip drivers and a logic network for connecting said on-chip receivers and said off-chip drivers in a predetermined logic configuration, a method of preventing oscillations in said integrated circuit logic chip during parametric testing of said off-chip drivers and on-chip receivers, comprising the steps of:

applying an inhibit signal to said off-chip drivers prior to performing said parametric tests on said off-chip drivers and on-chip receivers, said inhibit signal forcing said off-chip drivers to the same logical state regardless of the logic signals applied to said off-chip drivers by said logic network; and, performing said parametric tests on said off-chip drivers and on-chip receivers while said inhibit signal is applied to said off-chip drivers.

10. In an integrated circuit logic chip comprising a plurality of on-chip receivers, a plurality of off-chip drivers and a logic network for connecting said on-chip receivers and said off-chip drivers in a predetermined logic configuration, a method of preventing oscillations in said integrated circuit logic chip during testing of said logic network, comprising the steps of:

applying an inhibit signal to said off-chip drivers prior to applying a first test pattern to said on-chip receivers, said inhibit signal forcing said off-chip drivers to the same logical state regardless of the logic signals applied to said off-chip drivers by said logic network;

applying a first test pattern to said on-chip receivers; while said inhibit signal is applied to said off-chip drivers;

removing said inhibit signal from said off-chip drivers to thereby permit said off-chip drivers to change logical state in response to said first test pattern;

comparing the logic state of said off-chip drivers with the expected logical state of said off-chip drivers; and repeating the above sequence of steps for second and subsequent test patterns.

11. The method of claim 10 wherein said removing step comprises the step of removing said inhibit signal from said off-chip drivers after the transient responses of said logic network to said first input pattern have settled.

12. The method of claims 8, 9 or 10 wherein said inhibit signal applying step comprises the step of providing a driver inhibit network on said integrated circuit logic chip, said driver inhibit network being responsive to said inhibit signal and being connected to each of said off-chip drivers.

* * * * *